United States Patent
Seo et al.

(10) Patent No.: US 9,553,280 B2
(45) Date of Patent: Jan. 24, 2017

(54) ORGANIC LIGHT-EMITTING DIODE (OLED) DISPLAY COMPRISING FLEXIBLE SUBSTRATE, ELECTRONIC DEVICE INCLUDING THE SAME, AND METHOD OF MANUFACTURING THE OLED DISPLAY

(71) Applicant: Samsung Display Co., Ltd., Yongin, Gyeonggi-do (KR)

(72) Inventors: Jungjoon Seo, Yongin (KR); Hyunbeen Hwang, Yongin (KR); In Huh, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/789,212

(22) Filed: Jul. 1, 2015

(65) Prior Publication Data

US 2016/0141551 A1    May 19, 2016

(30) Foreign Application Priority Data

Nov. 17, 2014    (KR) .................. 10-2014-0160168

(51) Int. Cl.
| | | |
|---|---|---|
| H01L 51/52 | (2006.01) | |
| H01L 51/00 | (2006.01) | |
| H01L 51/56 | (2006.01) | |

(52) U.S. Cl.
CPC ....... *H01L 51/5253* (2013.01); *H01L 51/0097* (2013.01); *H01L 51/5256* (2013.01); *H01L 51/56* (2013.01); *H01L 2251/301* (2013.01)

(58) Field of Classification Search
CPC .............. H01L 51/0097; H01L 51/5253; H01L 51/5256
See application file for complete search history.

(56) References Cited

U.S. PATENT DOCUMENTS

2002/0140347 A1    10/2002    Weaver
2004/0195967 A1*   10/2004    Padiyath ................ B32B 27/08
                                                           313/512

(Continued)

FOREIGN PATENT DOCUMENTS

EP    2 871 685 A2    5/2015
JP    2003-086352 A    3/2003

(Continued)

OTHER PUBLICATIONS

Extended European Search Report dated Mar. 30, 2016 for European Patent Application No. EP 15 195 000.3 which shares priority of Korean Patent Application No. KR 10-23014-0160168 with subject U.S. Appl. No. 14/789,212, and cites the above-identified references numbered 1-3.

*Primary Examiner* — Eduardo A Rodela
*Assistant Examiner* — Christopher M Roland
(74) *Attorney, Agent, or Firm* — Knobbe Martens Olson & Bear LLP

(57) ABSTRACT

An organic light-emitting diode (OLED) display, electronic device including the same and method of manufacturing the OLED display are disclosed. In one aspect, the OLED display includes a first plastic layer, a first barrier layer formed over the first plastic layer and a first intermediate layer formed over the first barrier layer. The OLED display also includes a second plastic layer formed over the first intermediate layer, a second intermediate layer formed over the second plastic layer and a second barrier layer formed over the second intermediate layer. The OLED display further includes an OLED layer formed over the second barrier layer and a thin-film encapsulation layer encapsulating the OLED layer.

19 Claims, 15 Drawing Sheets

(56) References Cited

U.S. PATENT DOCUMENTS

| | | | |
|---|---|---|---|
| 2011/0156062 A1* | 6/2011 | Kim | H01L 51/0097 257/88 |
| 2012/0305981 A1 | 12/2012 | Park et al. | |
| 2013/0140547 A1* | 6/2013 | Lee | H01L 27/3274 257/40 |
| 2014/0024180 A1 | 1/2014 | Choi et al. | |
| 2014/0339517 A1 | 11/2014 | Park et al. | |
| 2014/0339527 A1 | 11/2014 | Lee et al. | |

FOREIGN PATENT DOCUMENTS

| | | |
|---|---|---|
| KR | 10-2014-0135565 A | 11/2014 |
| KR | 10-2015-0105595 A | 9/2015 |

* cited by examiner

ORGANIC LIGHT-EMITTING DIODE (OLED) DISPLAY COMPRISING FLEXIBLE SUBSTRATE, ELECTRONIC DEVICE INCLUDING THE SAME, AND METHOD OF MANUFACTURING THE OLED DISPLAY

INCORPORATION BY REFERENCE TO ANY PRIORITY APPLICATIONS

This application claims the benefit of Korean Patent Application No. 10-2014-0160168, filed on Nov. 17, 2014, in the Korean Intellectual Property Office, the disclosure of which is incorporated herein in its entirety by reference.

BACKGROUND

Field

The described technology generally relates to an organic light-emitting diode (OLED) display, an electronic device including the same, and a method of manufacturing the OLED display.

Description of the Related Technology

OLED displays are self-emissive and include a number of OLEDs each having a hole injection electrode, an electron injection electrode, and an organic emission layer that is interposed between the hole and electron injection electrodes. Light is emitted from the OLEDs when holes injected from the hole injection electrode and electrons injected from the electron injection electrode recombine with and annihilate each other in the organic emission layer. OLED displays have garnered attention as next-generation displays due to their superior characteristics such as low power consumption, high luminance, and high response speeds.

SUMMARY OF CERTAIN INVENTIVE ASPECTS

One inventive aspect is an OLED display including a flexible substrate having a low water vapor transmission rate (WVTR) and a high adhesive force, an electronic device including the OLED display, and a method of manufacturing the OLED display.

Additional aspects will be set forth in part in the description which follows and, in part, will be apparent from the description, or may be learned by practice of the presented embodiments.

Another aspect is an OLED display including a first plastic layer; a first barrier layer formed on the first plastic layer; a first intermediate layer formed on the first barrier layer; a second plastic layer formed on the first intermediate layer; a second intermediate layer formed on the second plastic layer; a second barrier layer formed on the second intermediate layer; an OLED layer formed on the second barrier layer; and a thin-film encapsulation layer that encapsulates the OLED layer.

The first intermediate layer can include amorphous silicon (a-silicon).

The second intermediate layer can include a-silicon.

The first intermediate layer can include a metal thin film.

The second intermediate layer can include a metal thin film.

The ultraviolet (UV) transmittance of the first intermediate layer can be equal to or greater than 10%.

Each of the first plastic layer and the second plastic layer can include at least one of the following materials: polyimide, polyethylene naphthalate, polyethylene terephthalate (PET), polyarylate, polycarbonate, polyethersulfone, and polyetherimide (PEI).

The thickness of the second plastic layer can be greater than a thickness of the first plastic layer.

The viscosity of the second plastic layer can be less than a viscosity of the first plastic layer.

The first barrier layer can include a first silicon nitride layer, and the second barrier layer can include a second silicon nitride layer, and the density of the second barrier layer can be greater than a density of the first silicon nitride layer.

The first barrier layer can further include a metal oxide film or a silicon oxide film.

The second barrier layer can further include a metal oxide film or a silicon oxide film.

The density of the first silicon nitride layer can be equal to or greater than about 2.2 g/cm3 and is equal to or less than about 2.4 g/cm3.

The thin-film encapsulation layer can include at least one of the following materials: an inorganic layer and an organic layer.

Another aspect is an electronic device including the OLED display.

Another aspect is a method of manufacturing an OLED display including preparing a carrier substrate; forming on the carrier substrate a mother flexible substrate including a first plastic layer, a first barrier layer, a first intermediate layer, a second plastic layer, a second intermediate layer, and a second barrier layer that are sequentially stacked; forming a plurality of OLED layers on the mother flexible substrate; forming a thin-film encapsulation layer that encapsulates the plurality of OLED layers; separating the mother flexible substrate from the carrier substrate; and dividing the plurality of OLED layers formed on the mother flexible substrate into a plurality of display units.

The separating of the mother flexible substrate from the carrier substrate can include separating the mother flexible substrate from the carrier substrate by emitting a laser beam toward a surface of the carrier substrate that is opposite to a surface of the carrier substrate on which the mother flexible substrate is formed.

The emitting of the laser beam can include emitting ultraviolet (UV) light.

The carrier substrate can be a glass substrate.

The first barrier layer can include at least a first silicon nitride layer, the second barrier layer can include a second silicon nitride layer, and a density of the second silicon nitride layer can be greater than a density of the first silicon nitride layer.

Another aspect is an OLED display comprising a first plastic layer; a first barrier layer formed over the first plastic layer; a first intermediate layer formed over the first barrier layer; a second plastic layer formed over the first intermediate layer; a second intermediate layer formed over the second plastic layer; a second barrier layer formed over the second intermediate layer; an OLED layer formed over the second barrier layer; and a thin-film encapsulation layer encapsulating the OLED layer.

In exemplary embodiments, the first intermediate layer comprises amorphous silicon. The second intermediate layer can comprise amorphous silicon. The first intermediate layer can comprise a metal thin film. The second intermediate layer can comprise a metal thin film. The ultraviolet (UV) transmittance of the first intermediate layer can be greater than or equal to about 10%. Each of the first plastic layer and the second plastic layer can comprise at least one of the following materials: polyimide, polyethylene naphthalate, polyethylene terephthalate (PET), polyarylate, polycarbonate, polyethersulfone, and polyetherimide (PEI).

In exemplary embodiments, the second plastic layer has a thickness that is greater than that of the first plastic layer. The second plastic layer can have a viscosity that is less than that of the first plastic layer. The first barrier layer can comprise a first silicon nitride layer, the second barrier layer can comprise a second silicon nitride layer, and the silicon nitride density of the second barrier layer can be greater than that of the first silicon nitride layer. The first barrier layer can further comprise a metal oxide film or a silicon oxide film.

In exemplary embodiments, the second barrier layer further comprises a metal oxide film or a silicon oxide film. The silicon nitride density of the first silicon nitride layer can be greater than or equal to about $2.2 \text{ g/cm}^3$ and can be less than or equal to about $2.4 \text{ g/cm}^3$. The thin-film encapsulation layer can comprise at least one of an inorganic layer and an organic layer.

Another aspect is an electronic device comprising an organic light-emitting diode (OLED) display, comprising: a first plastic layer; a first barrier layer formed over the first plastic layer; a first intermediate layer formed over the first barrier layer; a second plastic layer formed over the first intermediate layer; a second intermediate layer formed over the second plastic layer; a second barrier layer formed over the second intermediate layer; an OLED layer formed over the second barrier layer; and a thin-film encapsulation layer encapsulating the OLED layer.

Another aspect is a method of manufacturing an OLED display comprising preparing a carrier substrate; forming a mother flexible substrate on the carrier substrate, wherein the mother substrate comprises a first plastic layer, a first barrier layer, a first intermediate layer, a second plastic layer, a second intermediate layer, and a second barrier layer that are sequentially stacked; forming a plurality of OLED layers on the mother flexible substrate; forming a thin-film encapsulation layer so as to encapsulate the OLED layers; separating the mother flexible substrate from the carrier substrate; and dividing the OLED layers formed on the mother flexible substrate into a plurality of display units.

In exemplary embodiments, the separating of the mother flexible substrate from the carrier substrate comprises emitting laser light toward a surface of the carrier substrate that is opposite to a surface of the carrier substrate on which the mother flexible substrate is formed. The laser light can be ultraviolet (UV) light. The carrier substrate can be a glass substrate. The first barrier layer can comprise at least a first silicon nitride layer, the second barrier layer can comprise a second silicon nitride layer, and the silicon nitride density of the second silicon nitride layer can be greater than that of the first silicon nitride layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF CERTAIN INVENTIVE EMBODIMENTS

Figure 1:
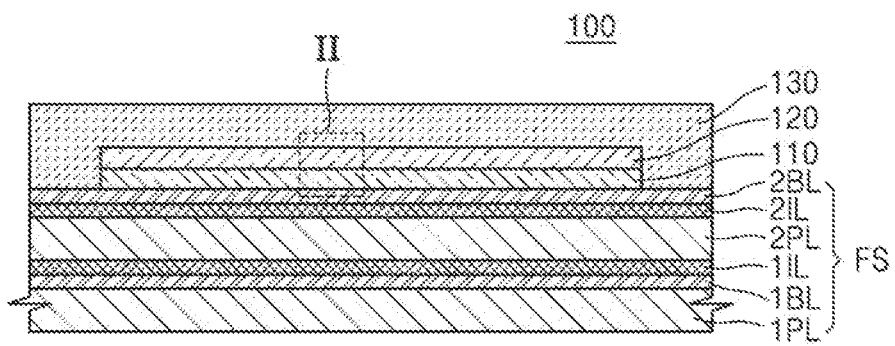
FIG. 1 is a cross-sectional view illustrating an OLED display according to an exemplary embodiment.

The described technology may include various embodiments and modifications and exemplary embodiments thereof will be illustrated in the drawings and will be described herein in detail. The effects and features of the described technology and the accompanying methods thereof will become apparent from the following description of the embodiments, taken in conjunction with the accompanying drawings. However, the described technology is not limited to the embodiments described below, and may be embodied in various modes.

The described technology will now be described more fully with reference to the accompanying drawings, in which exemplary embodiments are shown. In the drawings, the same or corresponding elements are denoted by the same reference numerals, and thus a repeated explanation thereof will not be given.

It will be understood that although the terms "first", "second", etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

The sizes of components in the drawings may be exaggerated for the sake of clarity. In other words, since the sizes and thicknesses of components in the drawings may be exaggerated, the following embodiments are not limited thereto.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view illustrating an OLED display 100 according to an exemplary embodiment.

Referring to FIG. 1, the OLED display 100 includes a flexible substrate FS, a TFT layer 110, an OLED layer 120, and a thin-film encapsulation layer 130.

The flexible substrate FS includes a first plastic layer 1PL, a first barrier layer 1BL, a first intermediate layer 1IL, a second plastic layer 2PL, a second intermediate layer 2IL, and a second barrier layer 2BL.

Each of the first plastic layer 1PL and the second plastic layer 2PL can be formed of a plastic material having high heat resistance and high durability such as polyimide, polyethylene naphthalate, polyethylene terephthalate (PET), polyarylate, polycarbonate, polyetherimide (PEI), or polyethersulfone.

Moisture or oxygen may more easily penetrate through the first plastic layer 1PL and the second plastic layer 2PL each formed of the plastic material than a glass substrate. Thus, an organic emission layer that is vulnerable to moisture or oxygen may be degraded when moisture or oxygen permeates through the first or second plastic layers 1PL or 2PL, thereby reducing the lifespan of an OLED.

In order to prevent the penetration of oxygen and moisture, the first barrier layer 1BL is formed on the first plastic layer 1PL and the second barrier layer 2BL is formed on the second plastic layer 2PL.

Each of the first barrier layer 1BL and the second barrier layer 2BL may be formed of an inorganic material such as metal oxide, silicon nitride, or silicon oxide. For example, each of the first barrier layer 1BL and the second barrier layer 2BL may have a single-layer structure or a multi-layer structure formed of an inorganic material such as AlO3, SiO2, or SiNx. A water vapor transmission rate (WVTRs) of each of the first barrier layer 1BL and the second barrier layer 2BL that is formed to have a single-layer structure or a multi-layer structure can be less than or equal to about $10^{-5}$ g/m$^2$ day.

The first intermediate layer 1IL is formed between the first barrier layer 1BL and the second plastic layer 2PL in order to increase an adhesive force between the first barrier layer 1BL and the second plastic layer 2PL.

The second intermediate layer 2IL is formed between the second plastic layer 2PL and the second barrier layer 2BL in order to increase an adhesive force between the second plastic layer 2PL and the second barrier layer 2BL.

The TFT layer 110 and the OLED layer 120 are formed on the flexible substrate FS.

Figure 2:
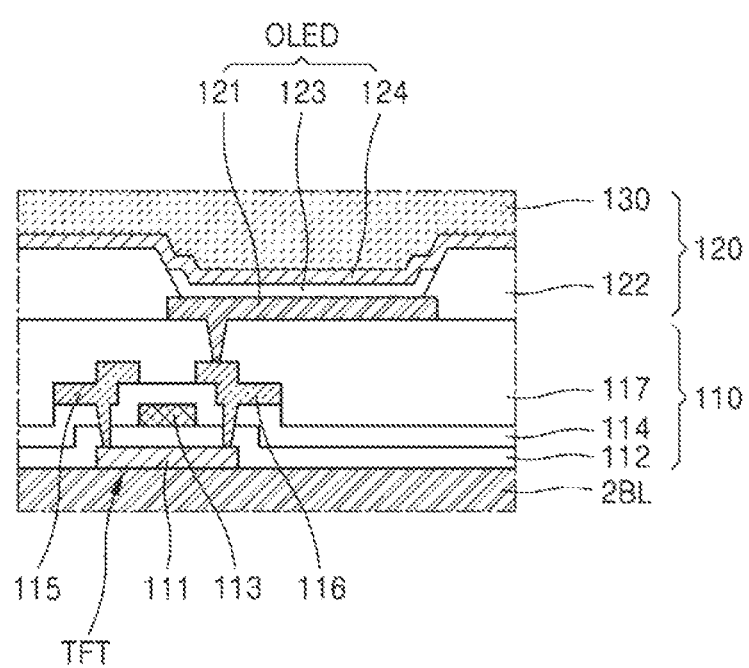
FIG. 2 is an enlarged view of portion II of FIG. 1, illustrating a thin-film transistor (TFT) layer and an OLED layer of the OLED display.

FIG. 2 is an enlarged view of portion II of FIG. 1, illustrating the TFT layer 110 and the OLED layer 120 of the OLED display 100.

Referring to FIG. 2, a TFT is formed on the second barrier layer 2BL and includes a semiconductor layer 111, a gate electrode 113, a source electrode 115, and a drain electrode 116. A gate insulation film 112 is formed between the semiconductor layer 111 and the gate electrode 113 and an interlayer insulation film 114 is formed between the gate electrode 113 and the source and drain electrodes 115 and 116. The semiconductor layer 111 can be formed of polycrystalline silicon (poly-silicon), amorphous silicon (a-silicon), an organic TFT, or a conductive oxide TFT. Although the TFT is a top gate type TFT in the FIG. 2 embodiment, the described technology is not limited thereto. That is, any suitable TFT variant including a bottom gate type TFT can be used.

Although the TFT is directly formed on the second barrier layer 2BL in the FIG. 2 embodiment, the described technology is not limited thereto. A buffer layer (not shown) can be further interposed between the second barrier layer 2BL and the TFT.

The buffer layer planarizes the flexible substrate FS and prevents impurity elements from penetrating from the flexible substrate FS into the semiconductor layer 111. The buffer layer can have a single- or multi-layer structure formed of silicon nitride and/or silicon oxide. Also, although not shown in FIG. 2, at least one capacitor can be connected to the TFT.

A passivation layer 117 is formed on the TFT and a pixel-defining layer 122 is formed on the passivation layer 117. The passivation layer 117 can protect the TFT and planarize a top surface of the TFT.

An OLED is connected to one of the source and drain electrodes 115 and 116 of the TFT. The OLED includes a pixel electrode 121, a counter electrode or common electrode 124, and a layer 123 including at least an organic emission layer that is interposed between the pixel electrode 121 and the counter electrode 124. The layer 123 including the organic emission layer can be formed of a low molecular or high molecular weight organic material. When the layer 123 is formed of a low molecular weight organic material, the layer 123 can be formed to have a single or complex structure in which a hole injection layer (HIL), a hole transport layer (HTL), an emission layer (EML), an electron transport layer (ETL), and an electron injection layer (EIL) are stacked. When the layer 123 is formed of a high molecular weight organic material, the layer 123 can have a structure including an HTL and an EML. The layer 123 including the organic emission layer can form one unit pixel including sub-pixels that emit red, green, and blue light. Also, the layer 123 including the organic emission layer can be formed by vertically stacking or combining layers including light-emitting materials that emit red, green, and blue light. As long as white light is emitted, any other combination of colors can be used. Also, the OLED display 100 can further include a color filter or a color changing layer that changes the white light to light of a predetermined color.

The counter electrode 124 can be formed in various ways and for example, can be commonly formed across a plurality of pixels.

The pixel electrode 121 can function as an anode and the counter electrode 124 can function as a cathode, or vice versa. Also, at least one of the pixel electrode 121 and the counter electrode 124 can be a transparent electrode through which light emitted from the EML is transmitted.

The OLED layer 120 is formed on the TFT layer 110 in FIGS. 1 and 2 for convenience of explanation. Accordingly, for example, parts of the TFT layer 110 and the OLED layer 120 can be formed on the same layer. For example, the gate electrode 113 of the TFT and the pixel electrode 121 of the OLED can be formed on the same layer.

The thin-film encapsulation layer 130 that encapsulates the OLED is formed on the flexible substrate FS. The thin-film encapsulation layer 130 can be formed of a plurality of inorganic layers or a combination of an inorganic layer and an organic layer.

The organic layer is formed of a polymer and can have a single- or multi-layer structure formed of any one of the following materials: polyethylene terephthalate, polyimide, polycarbonate, epoxy, polyethylene, and polyacrylate. The organic layer can be formed of polyacrylate, and specifically, can include a polymerized monomer composite including a diacrylate-based monomer and a triacrylate-based monomer. A monoacrylate-based monomer may be further included in the polymerized monomer composite. Also, the polymerized monomer composite may include, but is not limited to, a photoinitiator such as TPO.

The inorganic layer can have a single- or multi-layer structure including metal oxide or metal nitride. Specifically, the inorganic layer can include any of the following materials: SiNx, Al2O3, SiO2, and TiO2.

The uppermost layer of the thin-film encapsulation layer 130 that is exposed to the environment can be an inorganic layer in order to prevent water vapor transmission into the OLED.

The thin-film encapsulation layer 130 can include at least one sandwich structure in which at least one organic layer is inserted between at least two inorganic layers. Alternatively, the thin-film encapsulation layer 130 can include at least one sandwich structure in which at least one inorganic layer is inserted between at least two organic layers.

The thin-film encapsulation layer 130 can include a first inorganic layer, a first organic layer, and a second inorganic layer that are sequentially stacked on the top of the OLED. Alternatively, the thin-film encapsulation layer 130 can include a first inorganic layer, a first organic layer, a second inorganic layer, a second organic layer and a third inorganic layer that are sequentially stacked on the top of the OLED. Also, the thin-film encapsulation layer 130 can include a first inorganic layer, a first organic layer, a second inorganic layer, a second organic layer, a third inorganic layer, a third organic layer, and a fourth inorganic layer that are sequentially stacked on the top of the OLED.

A halogenated metal layer including Lithium Fluoride (LiF) can be further interposed between the OLED and the first inorganic layer. The halogenated metal layer can prevent the OLED from being damaged when the first inorganic layer is formed by using sputtering or plasma deposition.

The area of the first organic layer may be less than the area of the second inorganic layer and the area of the second organic layer may be less than the area of the third inorganic layer. Also, the first organic layer may be completely covered by the second inorganic layer and the second organic layer may also be completely covered by the third inorganic layer.

Although the thin-film encapsulation layer 130 is directly formed on the counter electrode 124 in the embodiment of FIGS. 1 and 2, this is exemplary and another element such as a filter or an adhesive material can be further interposed between the counter electrode 124 and the thin-film encapsulation layer 130.

Figure 3:
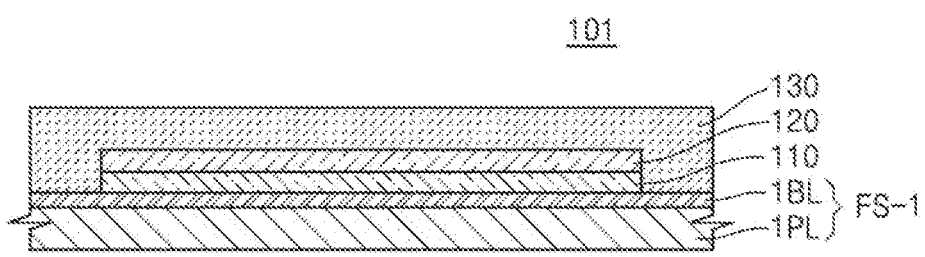
FIG. 3 is a cross-sectional view illustrating an OLED display according to a first comparative example.

FIG. 3 is a cross-sectional view illustrating an OLED display 101 according to a first comparative example.

Referring to FIG. 3, the OLED display 101 includes a flexible substrate FS-1, the TFT layer 110, the OLED layer 120, and the thin-film encapsulation layer 130.

The flexible substrate FS-1 includes the first plastic layer 1PL and the first barrier layer 1BL. That is, the flexible substrate FS-1 includes one plastic layer and one barrier layer.

When the flexible substrate FS-1 is formed by using only one plastic layer and one barrier layer as in the first comparative example, the surface of the first barrier layer 1BL can be damaged, for example, cracked, due to impurities or retraction defects formed on the first plastic layer 1PL and/or the first barrier layer 1BL. Moisture or oxygen may penetrate through the damaged surface, thereby damaging the OLED.

Figure 4:
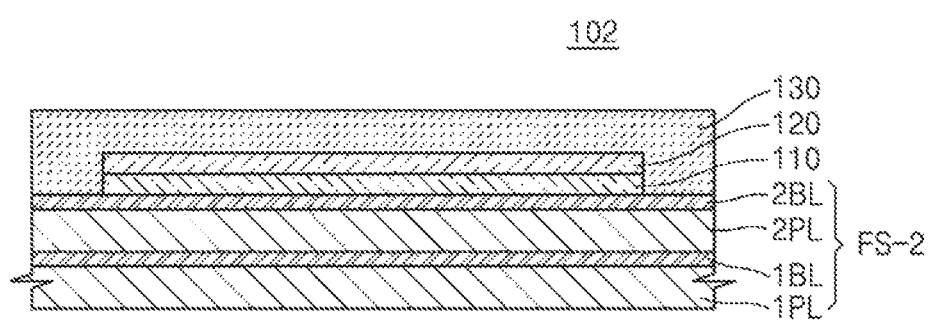
FIG. 4 is a cross-sectional view illustrating an OLED display according to a second comparative example.

FIG. 4 is a cross-sectional view illustrating an OLED display 102 according to a second comparative example.

Referring to FIG. 4, the OLED display 102 includes a flexible substrate FS-2, the TFT layer 110, the OLED layer 120, and the thin-film encapsulation layer 130.

The flexible substrate FS-2 includes the first plastic layer 1PL, the first barrier layer 1BL, the second plastic layer 2PL, and the second barrier layer 2BL. That is, the flexible substrate FS-2 is formed by repeatedly forming a structure including a plastic layer and a barrier layer formed on the plastic layer.

Impurities or retraction defects may be randomly formed on the second plastic layer 2PL and the second barrier layer 2BL as well as on the first plastic layer 1PL and the first barrier layer 1BL. However, since the average water vapor transmission path between a defective point and the OLED is longer in the OLED display 102 of the second comparative example than in the OLED display 101 of the first comparative example, even when the first barrier layer 1BL and/or the second barrier layer 2BL is damaged, for example, cracked, the OLED can be prevented from being damaged.

However, although dark spot defects can be reduced since the flexible substrate FS-2 of the second comparative example has a low WVTR, the adhesive force between the first barrier layer 1BL that is an inorganic film and the second plastic layer 2PL that is an organic film is relatively weak and the adhesive force between the second plastic layer 2PL that is an organic film and the second barrier layer 2BL is relatively weak, the first barrier layer 1BL and the second plastic layer 2PL may be detached from each other and the second plastic layer 2PL and the second barrier layer 2BL may be detached from each other during a manufacturing process.

However, in the OLED display 100 according to at least one exemplary embodiment, since the first intermediate layer 1IL is formed between the first barrier layer 1BL and the second plastic layer 2PL in order to increase the adhesive force between the first barrier layer 1BL and the second plastic layer 2PL, the first barrier layer 1BL and the second plastic layer 2PL can be prevented from being detached from each other.

Also, in the OLED display 100, since the second intermediate layer 2IL is formed between the second plastic layer 2PL and the second barrier layer 2BL in order to increase the adhesive force between the second plastic layer 2PL and the second barrier layer 2BL, the second plastic layer 2PL and the second barrier layer 2BL can be prevented from being detached from each other.

The first intermediate layer 1IL of the present exemplary embodiment can include an amorphous material. The first intermediate layer 1IL can include, for example, a-silicon as the amorphous material.

Alternatively, the first intermediate layer 1IL of the present exemplary embodiment can include a metal thin film. The metal thin film may include at least one of the following materials: indium tin oxide (ITO), aluminum (Al), titanium (Ti), and molybdenum (Mo). However, the material of the first intermediate layer 1IL is not limited to any of these materials and any material for increasing the adhesive force between the first barrier layer 1BL and the second plastic layer 2PL can be used.

Also, the first intermediate layer 1IL can be formed to have a ultraviolet (UV) light transmittance that is equal to or greater than about 10% so that the second plastic layer 2PL can be smoothly separated from the glass substrate GS during a process of separating a mother flexible substrate MFS from the glass substrate GS as will be described below with reference to FIGS. 11A and 11B. To this end, the first intermediate layer 1IL can be formed to have a thickness that is equal to or less than about 100 Å.

The second intermediate layer 2IL of the present exemplary embodiment can include an amorphous material. The second intermediate layer 2IL can include, for example, a-silicon as the amorphous material.

Alternatively, the second intermediate layer 2IL of the present exemplary embodiment can include a metal thin film. The metal thin film may include at least one of the following materials: ITO, Al, Ti, and Mo. However, the material of the second intermediate layer 2IL of the present exemplary embodiment is not limited to any of these materials, and any material for increasing the adhesive force between the second plastic layer 2PL and the second barrier layer 2BL can be used.

Table 1 shows the result obtained after performing detachment evaluation between the first barrier layer 1BL and the second plastic layer 2PL in which the first intermediate layer 1IL is not formed in the flexible substrate FS-2 before the flexible substrate FS-2 is divided into display units. Sample 1 uses a SiO2 single layer, Sample 2 uses a SiNx single layer, Sample 3 uses a SiO2/SiNx/SiO2 complex layer, and Sample 4 uses a SiNx/SiO2/SiNx that complex layer, as each of the first barrier layer 1BL and the second barrier layer 2BL.

TABLE 1

| Barrier layer | Sample 1 (O) | Sample 2 (N) | Sample 3 (ONO) | Sample 4 (NON) |
|---|---|---|---|---|
| Average adhesive force (gf/inch) | 67.73 | 216.41 | 82.83 | 164.38 |

Table 2 shows the result obtained after performing detachment evaluation between the first barrier layer 1BL and the second plastic layer 2PL in a display unit in which the first intermediate layer 1IL is not formed in the flexible substrate FS-2 after the flexible substrate FS-2 is divided into display units. Sample 5 uses a SiNx/SiO2 complex layer and Sample 6 uses a SiNx/SiO2/SiNx complex layer, as each of the first barrier layer 1BL and the second barrier layer 2BL.

TABLE 2

| Barrier layer | Sample 5 (NO) | Sample 6 (NON) |
|---|---|---|
| Average adhesive force (gf/inch) | 34.61 | 39.31 |

Table 3 shows the result obtained after performing detachment evaluation between the first barrier layer 1BL and the second plastic layer 2PL in which the first intermediate layer 1IL is formed in the flexible substrate FS before the flexible substrate FS is divided into display units. Sample 7 uses ITO, Sample 8 uses Ti, and Sample 9 uses Al, as the first intermediate layer 1IL. Sample 10 includes forming the first intermediate layer 1IL for 5 seconds by using a-Si and Sample 11 includes forming the first intermediate layer 1IL for 10 seconds by using a-Si. In Samples 7 through 11, the first and second barrier layers 1BL and 2BL are formed by using a SiNx/SiO2 complex layer respectively to thickness of 600 Å and 1500 Å.

TABLE 3

| Intermediate layer | Sample 7 (ITO) | Sample 8 (Ti) | Sample 9 (Al) | Sample 10 (a-Si) | Sample 11 (a-Si) |
|---|---|---|---|---|---|
| Average adhesive force (gf/inch) | Undetachable | Undetachable | Undetachable | 126.27 | 328.24 |

Table 4 shows a result obtained after performing detachment evaluation between the first barrier layer 1BL and the second plastic layer 2PL in a display unit in which the first intermediate layer 1IL is formed in the flexible substrate FS after the flexible substrate FS is divided into display units. Samples 7 through 11 are the same as those in Table 3.

TABLE 4

| Intermediate layer | Sample 7 (ITO) | Sample 8 (Ti) | Sample 9 (Al) | Sample 10 (a-Si) | Sample 11 (a-Si) |
|---|---|---|---|---|---|
| Average adhesive force (gf/inch) | Undetachable | Undetachable | Undetachable | Undetachable | Undetachable |

Referring to Table 1, before the structure in which the first intermediate layer 1IL is not formed is divided into display units, the average adhesive force between the first barrier layer 1BL and the second plastic layer 2PL ranges from about 60 gf/inch to about 200 gf/inch. Referring to Table 2, after the structure in which the first intermediate layer 1IL is not formed is divided into display units, the average adhesive force between the first barrier layer 1BL and the second plastic layer 2PL in the display units ranges from about 35 gf/inch to about 40 gf/inch which is low.

However, referring to Table 3, before the structure in which the first intermediate layer 1IL is formed is divided into display units, i) the average adhesive force between the first barrier layer 1BL and the second plastic layer 2PL ranges from about 100 gf/inch to about 300 gf/inch in the a-silicon and ii) the first barrier layer 1BL and the second plastic layer 2PL are undetachable in the metal thin film. Referring to Table 4, after the structure in which the first intermediate layer 1IL is formed is divided into display units, the first barrier layer 1BL and the second plastic layer 2PL are undetachable in a display unit, and the average adhesive force is not measurable. That is, when the first intermediate layer 1IL is interposed between the first barrier layer 1BL and the second plastic layer 2PL, the adhesive force between the first barrier layer 1BL and the second plastic layer 2PL is greatly increased.

The OLED display 100 that is divided as a display unit is subjected to a process of adhering a chip-on-film (COF, not shown) on the display unit and a module assembly process of adhering a polarization film (not shown). While the COF is adhered, stress due to bending may be applied to the flexible substrate FS, the polarization film may be contracted and the second plastic layer 2PL and the second barrier layer 2BL may be detached from each other. However, in the OLED display 100, since the second intermediate layer 2IL is formed between the second plastic layer 2PL and the second barrier layer 2BL in order to increase the adhesive force between the second plastic layer 2PL and the second barrier layer 2BL, the second plastic layer 2PL and the second barrier layer 2BL can be prevented from being detached from each other.

Accordingly, in the OLED display 100 according to the present exemplary embodiment, since the flexible substrate FS is formed by alternately stacking two plastic layers and two barrier layers and interposed an intermediate layer between adjacent plastic and barrier layers, the average water vapor transmission path can be increased and the adhesive force between a lower barrier layer and an upper plastic layer that is adjacent to the lower barrier layer can be increased, thereby preventing the OLED display 100 from undergoing detachment defects.

Figure 11:
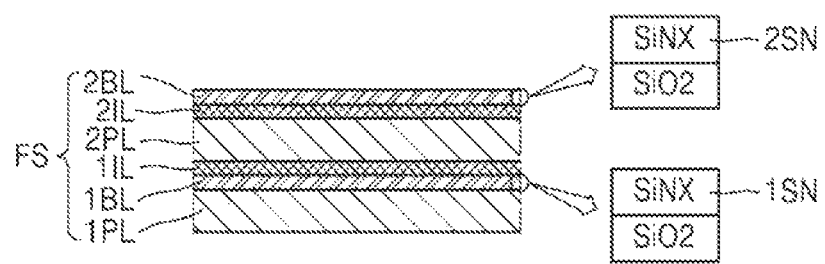
FIG. 11 is a view illustrating a flexible substrate of the OLED display of FIG. 1 according to another exemplary embodiment.

FIG. 11 is a view illustrating the flexible substrate FS of the OLED display 100 of FIG. 1 according to another exemplary embodiment.

Referring to FIG. 11, the flexible substrate FS includes the first plastic layer 1PL, the first barrier layer 1BL, the first intermediate layer 1IL, the second plastic layer 2PL, the second intermediate layer 2IL, and the second barrier layer 2BL.

In the present exemplary embodiment, the first barrier layer 1BL and the second barrier layer 2BL respectively include at least one silicon nitride layer 1SN and at least one silicon nitride layer 2SN. The silicon nitride density of the silicon nitride layer 1SN of the first barrier layer 1BL is less than the silicon nitride density of the silicon nitride layer 2SN of the second barrier layer 2BL. For example, the silicon nitride density of the silicon nitride layer 1SN of the first barrier layer 1BL can be equal to or greater than about 2.2 g/cm$^3$ and can be equal to or less than about 2.4 g/cm$^3$. At least one layer of the first barrier layer 1BL and the second barrier layer 2BL is formed of silicon nitride in order to prevent water vapor transmission through a plastic substrate, the hydrogen content included in the silicon nitride may affect device characteristics of the TFT.

Figure 12:
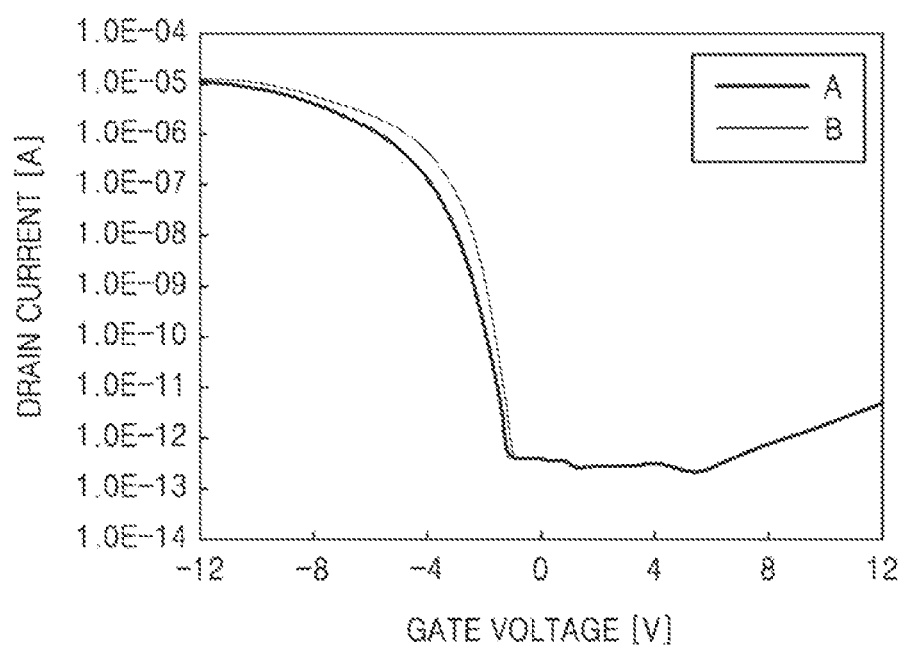
FIG. 12 is a graph illustrating a relationship between a gate voltage and a drain current of an OLED.

FIG. 12 is a graph illustrating the relationship between a gate voltage and a drain current of the OLED when a flexible structure has a structure A in which a silicon nitride layer is formed in the first barrier layer 1BL and a silicon nitride layer is not formed in the second barrier layer 2BL is used and when a flexible substrate having a structure B in which silicon nitride layers having the same density are formed in both the first barrier layer 1BL and the second barrier layer 2BL is used.

The slope of the curve for the structure B is greater than that of the curve for the structure A. However, the change in the slope of the curve that is formed when the structure B is used occurs only in some OLEDs and does not occur in all OLEDs. Accordingly, in the structure B, a current compensation design is necessary in order to achieve uniform device characteristics. However, when a driving voltage is reduced according to the current compensation design, a low grayscale off defect wherein there is insufficient brightness for low grayscales may occur.

Table 5 shows a low grayscale off defect that occurs on 20 candelas (cd) when the flexible substrates having the structure A and the structure B are used.

TABLE 5

| Structure of flexible substrate | A | B |
|---|---|---|
| Defect rate | 1.6% | 79.3% |

As shown in Table 5, the number of low grayscale off defects is greatly increased in the structure B. This is because device characteristics of the devices are non-uniform due to hydrogen that is randomly generated in the silicon nitride layer of the second barrier layer 2BL.

However, when the structure A is selected in order to reduce the number of low grayscale off defects, the WVTR rate that is an important characteristic of a barrier is increased.

However, when the silicon nitride density of the silicon nitride layer 1SN of the first barrier layer 1BL is less than the silicon nitride density of the silicon nitride layer 2SN of the second barrier layer 2BL as in the flexible substrate FS of the present exemplary embodiment, deviation of the WVTR of an OLED display can be reduced and characteristics of the TFTs can be improved.

Figure 13:
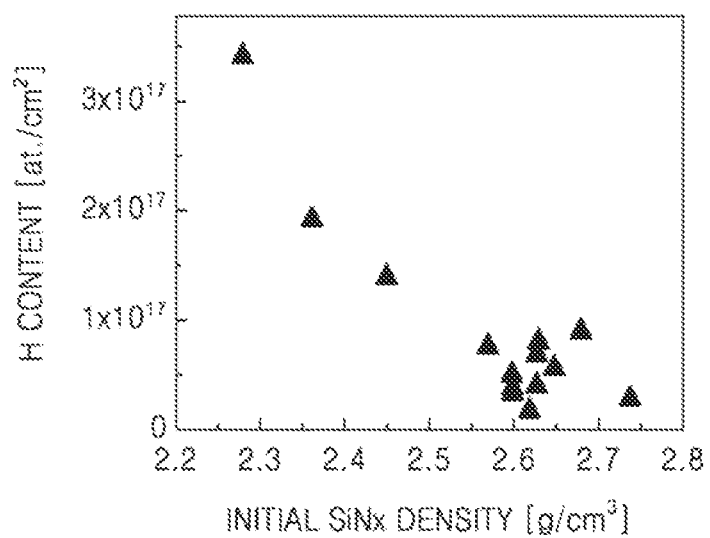
FIG. 13 is a graph illustrating a relationship between an initial silicon nitride density and hydrogen (H) content.

FIG. 13 is a graph illustrating the relationship between initial silicon nitride density and hydrogen content.

Referring to FIG. 13, as the initial silicon nitride density decreases, the hydrogen content increases. As in the present exemplary embodiment, the silicon nitride density of the silicon nitride layer 1SN of the first barrier layer 1BL can be equal to or less than about 2.4 g/cm$^3$ so that the silicon nitride layer 1SN can be formed to be porous. However, it is difficult to form the silicon nitride layer 1SN so that the silicon nitride density is less than about 2.2 g/cm$^3$ due to processing reasons. Since the silicon nitride layer 1SN is porous, the hydrogen content is increased to be equal to or greater than about $1\times10^{17}$ at/cm$^2$, thereby increasing the amount of hydrogen that is generated during thermal treatment performed on the silicon nitride layer 1SN. The increased hydrogen may cure a defective site of the TFT, thereby improving device characteristics of the TFT. Also, since the silicon nitride layer 1SN is formed in the first barrier layer 1BL, the WVTR can be reduced.

Since the silicon nitride density of the silicon nitride layer 1SN of the first barrier layer 1BL is less than the silicon nitride density of the silicon nitride layer 2SN of the second barrier layer 2BL, the refractive index of the silicon nitride layer 1SN of the first barrier layer 1BL can be less than a refractive index of the silicon nitride layer 2SN of the second barrier layer 2BL.

Although one silicon nitride layer 1SN of the first barrier layer 1BL is formed on a silicon oxide layer in FIG. 13, the described technology is not limited thereto. For example, only one silicon nitride layer can be formed in the first barrier layer 1BL. Alternatively, a plurality of silicon nitride layers can be formed in the first barrier layer 1BL. Alternatively, a plurality of silicon oxide layers and a plurality of silicon nitride layers can be formed in the first barrier layer 1BL.

FIGS. 5A through 10 are views for explaining a method of manufacturing the OLED display 100, according to an exemplary embodiment.

Figure 5A:
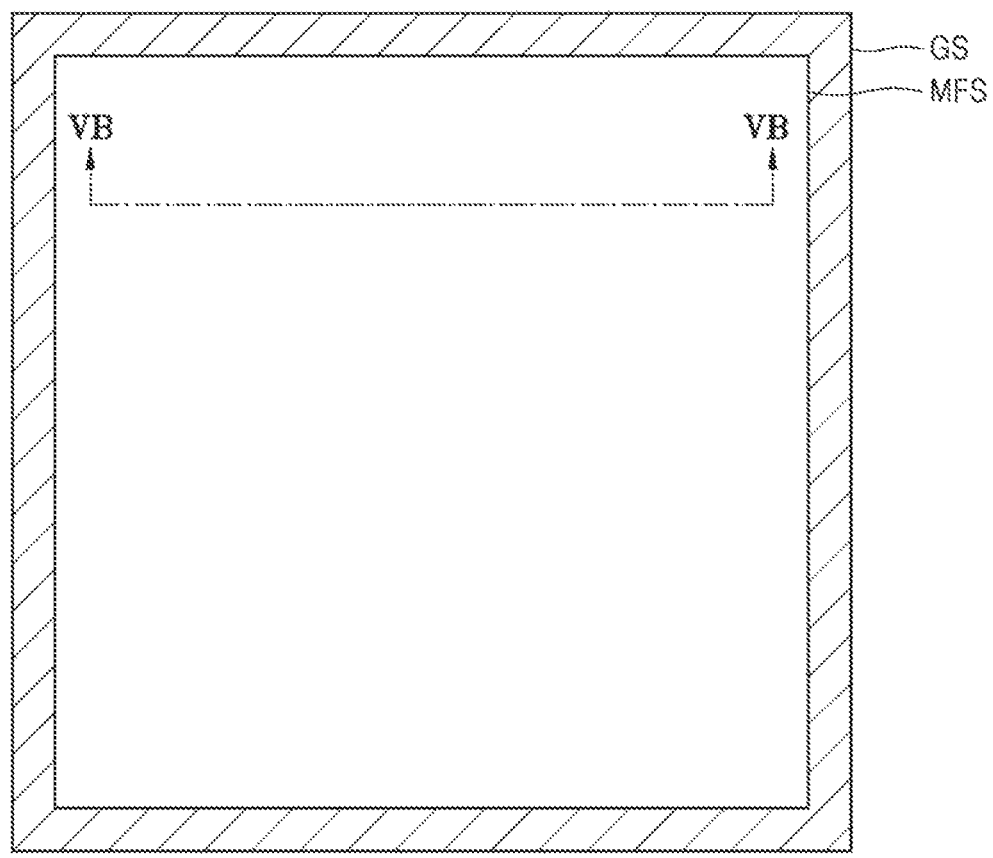
FIG. 5A is a plan view for explaining an operation of forming a mother flexible substrate on a glass substrate.
Figure 5B:
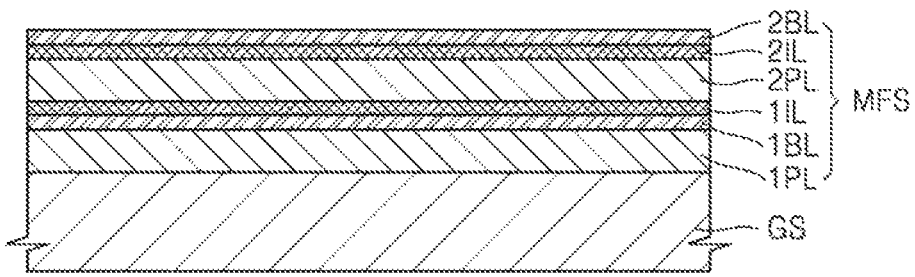
FIG. 5B is a cross-sectional view taken along line VB-VB of FIG. 5A.

FIG. 5A is a plan view for explaining an operation of forming the mother flexible substrate MFS on the glass substrate GS. FIG. 5B is a cross-sectional view taken along line VB-VB of FIG. 5A.

Referring to FIGS. 5A and 5B, the mother flexible substrate MFS is formed on the glass substrate GS.

Since the mother flexible substrate MFS formed of a plastic material is bendable or stretchable when heat is applied thereto, it is difficult to precisely form thin film patterns such as various electrodes or conductive wirings on the mother flexible substrate MFS. Accordingly, various thin film patterns are formed on the mother flexible substrate MFS which is adhered to the glass substrate GS that is a carrier substrate.

First, the first plastic layer 1PS is formed on the glass substrate GS. The first plastic layer 1PS can be formed by coating and curing a plastic polymer solution including at least one of the following materials: polyimide, polyethylene naphthalate, PET, polyarylate, polycarbonate, PEI, and polyethersulfone on the glass substrate GS, or by laminating a polymer film on the glass substrate GS. The curing can be performed by using any of various methods such as thermal curing, UV curing, or electron-beam curing.

Next, the first barrier layer 1BL is formed on the first plastic layer 1PS. The first barrier layer 1BL can be formed to have a single- or multi-layer structure by using an inorganic material such as AlO3, SiO2, or SiNx by using chemical vapor deposition (CVD), plasma enhanced chemical vapor deposition (PECVD), or atomic layer deposition (ALD).

Next, the first intermediate layer 1IL is formed on the first barrier layer 1BL. The first intermediate layer 1IL can be formed to have a single- or multi-layer structure by using an amorphous material such as a-silicon or a metal thin film such as ITO, Al, Ti, or Mo by using CVD, PECVD, or ALD.

Next, the second plastic layer 2PL is formed on the first intermediate layer 1IL. The second plastic layer 2PL can be formed of the same material by using the same method as those of the first plastic layer 1PL.

However, the second plastic layer 2PL can be formed to have a lower viscosity than the first plastic layer 1PL. When the first and second plastic layers 1PL and 2PL are formed by using coating, many impurities are contained in a coating solution having a high viscosity, and thus the impurities may also be coated. Accordingly, the second plastic layer 2PL may have a lower viscosity than the first plastic layer 1PL so that filtering is performed while the second plastic layer 2PL is coated. In this embodiment, the impurities can be reduced by forming the second plastic layer 2PL by using a filtered material. Since a coating solution that is used to form the second plastic layer 2PL has a low viscosity, the impurities that are generated between the first plastic layer 1PL and the first barrier layer 1BL can be covered.

Although the first plastic layer 1PS and the second plastic layer 2PS have the same thickness in FIGS. 1 and 5A, the described technology is not limited thereto. The penetration time during which oxygen and moisture penetrate from the outside of the flexible substrate FS is affected more by the thickness of the second plastic layer 2PS that is closer to the OLED layer 120 than that of the first plastic layer 1PS. Accordingly, the OLED can be prevented from being degraded by delaying the penetration time by increasing the thickness of the second plastic layer 2PS that is closer to the OLED layer 120 to be greater than that of the first plastic layer 1PS.

Next, the second intermediate layer 2IL is formed on the second plastic layer 2PL. The second intermediate layer 2IL can be formed to have a single- or multi-layer structure by using an amorphous material such as a-silicon or a metal thin film such as ITO, Al, Ti, or Mo by using CVD, PECVD, or ALD.

Next, the second barrier layer 2BL is formed on the second intermediate layer 2IL. The second barrier layer 2BL can be formed of the same material by using the same method as those of the first barrier layer 1BL.

Figure 6A:
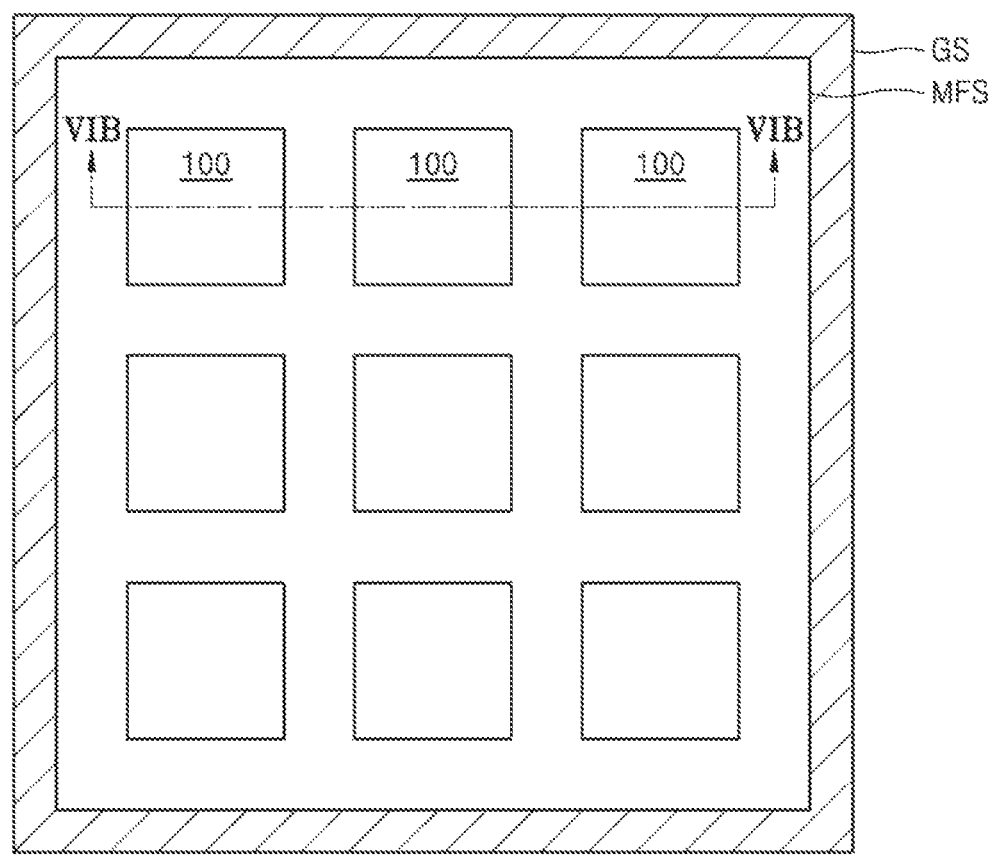
FIG. 6A is a plan view for explaining a process of forming a plurality of OLED displays on the mother flexible substrate.
Figure 6B:
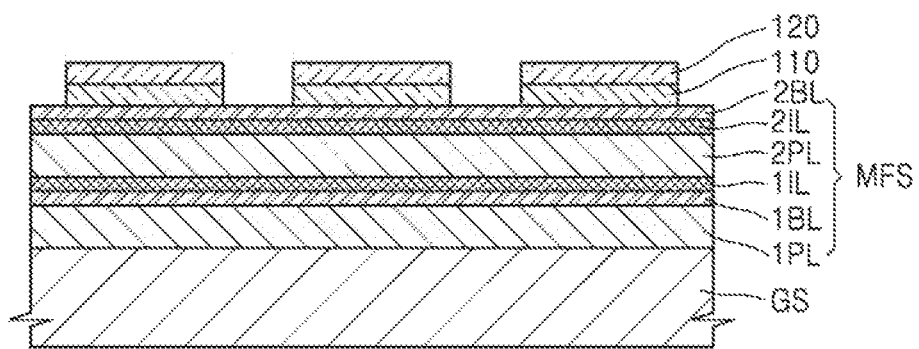
FIG. 6B is a cross-sectional view taken along line VIB-VIB of FIG. 6A.

FIG. 6A is a plan view for explaining a process of forming a plurality of units of OLED displays 100 on the mother flexible substrate MFS. FIG. 6B is a cross-sectional view taken along line VIB-VIB of FIG. 6A.

Referring to FIGS. 6A and 6B, the plurality of units of OLED displays 100 including the TFT layer 110 and the OLED layer 120 are formed on the mother flexible substrate MFS.

Any of various methods can be used according to the semiconductor layer 111 (see FIG. 2) of the TFT layer 110. For example, when the semiconductor layer 111 is formed of poly-silicon, a-silicon, or conductive oxide, any of deposition methods such as PECVD, atmospheric pressure CVD (APCVD), low pressure CVD (LPCVD) can be used. When the semiconductor layer 111 is formed of an organic TFT, coating or printing can be used. When the semiconductor layer 111 is formed of poly-silicon, any of various crystallization methods such as rapid thermal annealing (RTA), solid phase crystallization (SPC), excimer laser annealing (ELA), metal induced crystallization (MIC), metal induced lateral crystallization (MILC), or sequential lateral solidification (SLS) can be used.

The gate electrode 113 (see FIG. 2), the source electrode 115 (see FIG. 2), the drain electrode 116 (see FIG. 2), and various wirings (not shown) can be deposited on the TFT layer 110 by using CVD, PECVD, or ALD, and then can be patterned by using photolithography.

The layer 123 (see FIG. 2) including the organic emission layer of the OLED layer 120 can be formed by using any of various methods such as deposition, coating, printing, or light-heat transfer.

Although not shown in FIG. 6B, a buffer layer (not shown) can be further interposed between the second barrier layer 2BL and the TFT layer 110.

Figure 7:
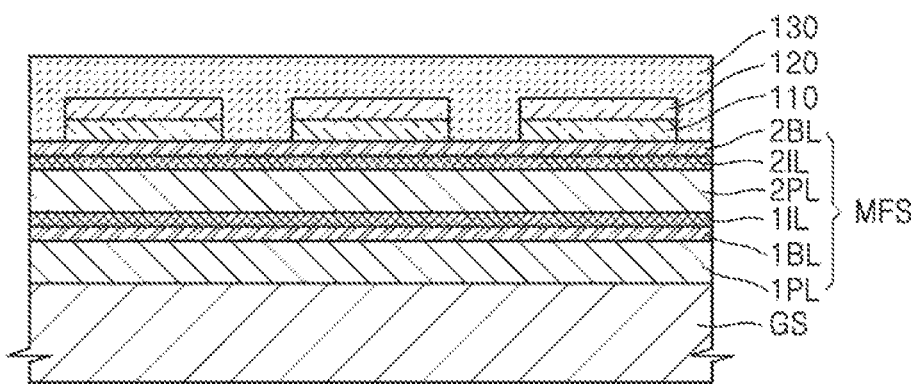
FIG. 7 is a cross-sectional view for explaining a process of forming a thin-film encapsulation layer that encapsulates a plurality of the OLED layers on the mother flexible substrate.

FIG. 7 is a cross-sectional view for explaining a process of forming the thin-film encapsulation layer 130 that encapsulates the plurality of OLED layers 120 on the mother flexible substrate MFS.

The thin-film encapsulation layer 130 can be formed of a plurality of inorganic layers or a combination of an inorganic layer and an organic layer as described above. The inorganic layer and the organic layer can be formed by using any of various methods such as CVD, PECVD, or sputtering.

Although one thin-film encapsulation layer 130 commonly covers the plurality units of OLED displays 100 in FIG. 7, the described technology is not limited thereto. That is, the thin-film encapsulation layer 130 can individually cover the units of OLED displays 100.

Figure 8:
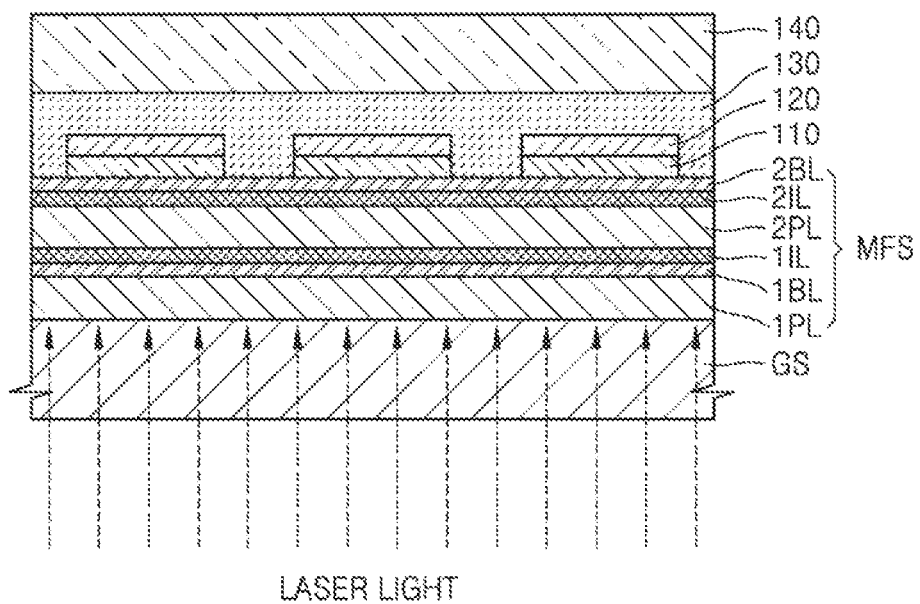
FIGS. 8 and 9 are cross-sectional views for explaining a process of separating the mother flexible substrate from the glass substrate.
Figure 9:
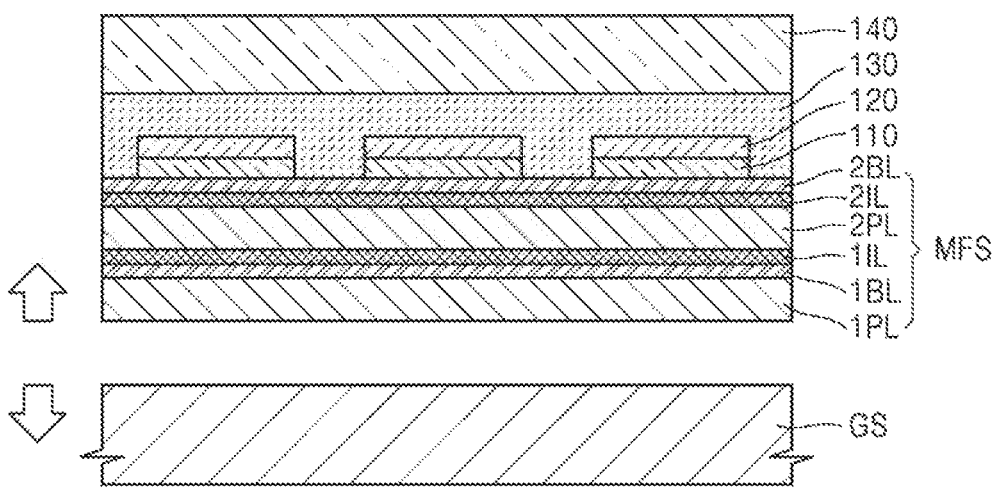

FIGS. 8 and 9 are cross-sectional views for explaining a process of separating the mother flexible substrate MFS from the glass substrate GS.

Referring to FIG. 8, in order to separate the mother flexible substrate MFS from the glass substrate GS, laser light is emitted to a surface of the glass substrate GS that is opposite to a surface of the glass substrate GS on which the mother flexible substrate MFS is formed.

UV light can be emitted as laser light by using an excimer laser. The emitted UV light is transmitted through the glass substrate GS and is absorbed by the first plastic layer 1PS and the second plastic layer 2PS. A binding force between the first and second plastic layers 1PS and 2PS and the glass substrate GS is reduced due to absorbed energy. The first barrier layer 1BL or the second barrier layer 2BL is easily broken by an external tensile force. Accordingly, the mother flexible substrate MFS can be separated from the glass substrate GS by appropriately applying an external tensile force to the mother flexible substrate MFS and the glass substrate GS in a direction marked by an arrow of FIG. 9.

Before the process of separating the mother flexible substrate MFS from the glass substrate GS, a first protective film 140 can be attached to the thin-film encapsulation layer 130. The first protective film 140 can be used as an optical member such as a polarization film.

Figure 10:
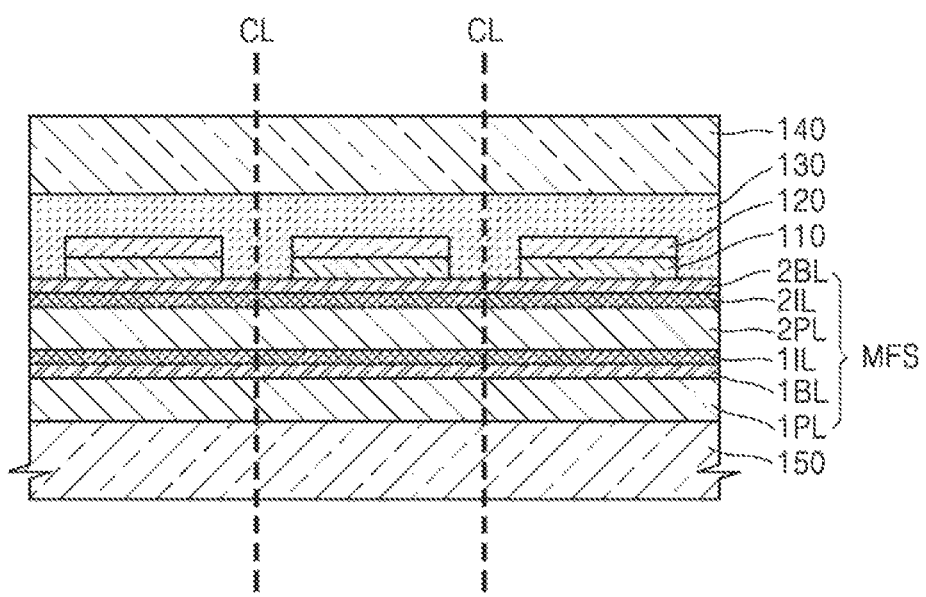
FIG. 10 is a cross-sectional view for explaining a process of dividing the OLED layer that is formed on the mother flexible substrate into the plurality of OLED displays.

FIG. 10 is a cross-sectional view for explaining a process of dividing the OLED layer 120 that is formed on the mother flexible substrate MFS into the plurality of OLED displays 100.

After the mother flexible substrate MFS is separated from the glass substrate GS, a second protective film 150 can be attached to a rear surface of the mother flexible substrate MFS and then the mother flexible substrate MFS can be divided into the plurality of OLED displays 100. The second protective film 150 can be used as an optical member such as a polarization film.

The OLED layer 120 that is formed on the mother flexible substrate MFS can be divided into the plurality of OLED displays 100 by cutting the mother flexible substrate MFS along a cutting line CL of a non-display area between the OLED displays 100 by using a cutting wheel or a laser cutter.

Although two plastic layers and two barrier layers are alternately stacked in FIGS. 5A through 10, more plastic layers and barrier layers may be stacked if necessary. In these embodiments, an intermediate layer can be further interposed between adjacent plastic and barrier layers if necessary.

Also, although not shown in FIGS. 5A through 10, the first intermediate layer 1IL and the second intermediate layer 2IL can be patterned to be formed only in an area corresponding to an area where the OLED layer 120 is formed.

Although the described technology has been explained based on the structure of an OLED display in the above exemplary embodiments, the described technology may be applied to various flexible displays as well as OLED displays. For example, the described technology may be applied to various electronic devices such as mobile devices, navigation systems, video cameras, laptops, tablet computers, flat-screen TVs, and video projectors.

As described above, according to one or more of the above exemplary embodiments, since a flexible substrate is formed by alternately stacking two plastic layers and two barrier layers and interposing an intermediate layer between adjacent plastic and barrier layers, the average water vapor transmission path is increased, thereby preventing an OLED from being degraded.

The adhesive force between a lower barrier layer and an upper plastic layer that is adjacent to the lower barrier layer is increased, thereby preventing the OLED display from undergoing detachment defects.

The adhesive force between the upper plastic layer and an upper barrier layer that is adjacent to the upper plastic layer is increased, thereby preventing the OLED display from undergoing detachment defects.

Each barrier layer is formed to include silicon nitride and the silicon nitride density in a barrier layer that is far from the OLED is less than the silicon nitride density in a barrier layer that is close to the OLED, thereby improving TFT characteristics and reducing a deviation of a WVTR of the flexible substrate.

While one or more exemplary embodiments have been described with reference to the figures, it will be understood by those of ordinary skill in the art that various changes in form and details may be made therein without departing from the spirit and scope as defined by the following claims.

What is claimed is:

1. An organic light-emitting diode (OLED) display, comprising:
 a first plastic layer;
 a first barrier layer formed over the first plastic layer;
 a first intermediate layer formed over the first barrier layer, wherein the first intermediate layer comprises amorphous silicon;
 a second plastic layer formed over the first intermediate layer;
 a second intermediate layer formed over the second plastic layer;
 a second barrier layer formed over the second intermediate layer;
 an OLED layer formed over the second barrier layer; and
 a thin-film encapsulation layer encapsulating the OLED layer.

2. The OLED display of claim 1, wherein the second intermediate layer comprises amorphous silicon.

3. The OLED display of claim 1, wherein the first intermediate layer comprises a metal thin film.

4. The OLED display of claim 1, wherein the second intermediate layer comprises a metal thin film.

5. The OLED display of claim 1, wherein an ultraviolet (UV) transmittance of the first intermediate layer is greater than or equal to about 10%.

6. The OLED display of claim 1, wherein each of the first plastic layer and the second plastic layer comprises at least one of the following materials: polyimide, polyethylene naphthalate, polyethylene terephthalate (PET), polyarylate, polycarbonate, polyethersulfone, and polyetherimide (PEI).

7. The OLED display of claim 1, wherein the second plastic layer has a thickness that is greater than that of the first plastic layer.

8. The OLED display of claim 1, wherein the second plastic layer has a viscosity that is less than that of the first plastic layer.

9. The OLED display of claim 1, wherein the first barrier layer comprises a first silicon nitride layer, wherein the second barrier layer comprises a second silicon nitride layer, and wherein a silicon nitride density of the second barrier layer is greater than that of the first silicon nitride layer.

10. The OLED display of claim 9, wherein the first barrier layer further comprises a metal oxide film or a silicon oxide film.

11. The OLED display of claim 9, wherein the second barrier layer further comprises a metal oxide film or a silicon oxide film.

12. The OLED display of claim 9, wherein the silicon nitride density of the first silicon nitride layer is greater than or equal to about 2.2 $g/cm^3$ and is less than or equal to about 2.4 $g/cm^3$.

13. The OLED display of claim 1, wherein the thin-film encapsulation layer comprises at least one of an inorganic layer and an organic layer.

14. An electronic device comprising:
 an organic light-emitting diode (OLED) display, comprising:
  a first plastic layer;
  a first barrier layer formed over the first plastic layer;
  a first intermediate layer formed over the first barrier layer, wherein the first intermediate layer comprises amorphous silicon;
  a second plastic layer formed over the first intermediate layer;
  a second barrier layer formed over the second plastic layer;

an OLED layer formed over the second barrier layer; and a thin-film encapsulation layer encapsulating the OLED layer.

15. A method of manufacturing an organic light-emitting diode (OLED) display, comprising:

preparing a carrier substrate;

forming a mother flexible substrate on the carrier substrate, wherein the mother substrate comprises a first plastic layer, a first barrier layer, a first intermediate layer, a second plastic layer, and a second barrier layer that are sequentially stacked, wherein the first intermediate layer comprises amorphous silicon;

forming a plurality of OLED layers on the mother flexible substrate;

forming a thin-film encapsulation layer so as to encapsulate the OLED layers;

separating the mother flexible substrate from the carrier substrate; and dividing the OLED layers formed on the mother flexible substrate into a plurality of display units.

16. The method of claim 15, wherein the separating of the mother flexible substrate from the carrier substrate comprises emitting laser light toward a surface of the carrier substrate that is opposite to a surface of the carrier substrate on which the mother flexible substrate is formed.

17. The method of claim 16, wherein the laser light is ultraviolet (UV) light.

18. The method of claim 15, wherein the carrier substrate is a glass substrate.

19. The method of claim 15, wherein the first barrier layer comprises at least a first silicon nitride layer, wherein the second barrier layer comprises a second silicon nitride layer, and wherein a silicon nitride density of the second silicon nitride layer is greater than that of the first silicon nitride layer.

* * * * *